(12) United States Patent
Wang et al.

(10) Patent No.: US 6,645,678 B2
(45) Date of Patent: Nov. 11, 2003

(54) METHOD AND APPARATUS FOR MAKING AN INTEGRATED CIRCUIT USING POLARIZATION PROPERTIES OF LIGHT

(75) Inventors: Ruoping Wang, Austin, TX (US); Warren D. Grobman, Austin, TX (US); James Lee Clingan, Jr., Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 106 days.

(21) Appl. No.: 09/727,666

(22) Filed: Dec. 1, 2000

(65) Prior Publication Data

US 2002/0068227 A1 Jun. 6, 2002

(51) Int. Cl.[7] .............................................. G03F 9/00
(52) U.S. Cl. ......................................................... 430/5
(58) Field of Search .................... 430/5, 322; 359/489, 359/498; 355/53, 71, 77

(56) References Cited

U.S. PATENT DOCUMENTS

| | | | |
|---|---|---|---|
| 5,245,470 A | 9/1993 | Keum | 359/485 |
| 5,292,623 A | 3/1994 | Kemp et al. | 430/313 |
| 5,308,741 A | 5/1994 | Kemp | 430/312 |
| 5,541,026 A | 7/1996 | Matsumoto | |
| 5,663,016 A | 9/1997 | Hong | 430/5 |
| 5,677,755 A | 10/1997 | Oshida et al. | |
| 6,163,367 A | 12/2000 | Obszarny | |

FOREIGN PATENT DOCUMENTS

| | | |
|---|---|---|
| JP | 05011434 | 1/1993 |
| JP | 05241324 | 9/1993 |
| JP | 07036174 | 2/1995 |
| JP | 09120154 | 5/1997 |

OTHER PUBLICATIONS

Bornig et al., "The Impact of Polarized Illumination on Imaging Characteristics in Optical Microlithography," Elsevier Science B.V., Microelectronic Engineering 27 (1995) pp. 217–220.

Grobman et al., Reticle Enhancement Technology: Implications and Challenges for Physical Design, Motorola Digital DNA Laboratories, Austin, TX, pp. 73–77.

Kling et al., Practicing Extension of 248 DUV Optical Lithography Using Trim–Mask PSM (2 pgs.).

Kling et al., Practicing Extension of 248 DUV Optical Lithography Using Trim–Mask PSM (12 pp.).

*Primary Examiner*—S. Rosasco
(74) *Attorney, Agent, or Firm*—James L. Clingan, Jr.; Robert L. King; Kim-Marie Vo (57) ABSTRACT

A method and apparatus for making an integrated circuit takes advantage of both polarized and phase shifted light in order to achieve a fine feature. The feature on the integrated circuit is obtained by exposing a first region to light that has a first polarization state, exposing a second portion of the wafer to polarized light in the first polarization state but which is also phase shifted about 180 degrees. A region between the first and second region may be unexposed to light. The region between the first and the second region is the position of the fine feature. In areas where the first region and the second region need to be joined together but no feature is intended to be formed, there is a third region between the first and second regions which is exposed to polarized light that has a second polarization state which is orthogonal to that of the polarized light which exposes the first and second regions. The result is that the boundary between either the first or second region and the third region is fully exposed. Thus there is no artifact or extra feature formed in this boundary area between the first and second regions. Masks are made with corresponding regions to the first, second, and third regions so that the light in these polarized and phase shifted states is properly provided to the integrated circuit.

21 Claims, 4 Drawing Sheets

METHOD AND APPARATUS FOR MAKING AN INTEGRATED CIRCUIT USING POLARIZATION PROPERTIES OF LIGHT

FIELD OF THE INVENTION

The present invention relates generally to integrated circuit technology and more particularly to using various properties of light in the making of integrated circuits.

BACKGROUND OF THE INVENTION

As semiconductor technology progresses, the dimensions of features, for example, line widths, gate dimensions, etc., in integrated circuits are shrinking. Many obstacles must be overcome in order to process an integrated circuit with features of these dimensions. One such problem exists in photolithography because the featured dimensions are too small relative to the wavelength of the light being used. Phase shift masks provide a technique for alleviating this problem by providing desirable destructive interference at the areas where the fine dimensions are present. This approach results in other problems associated with leaving under-exposed photoresist in areas where the photoresist was intended to be fully exposed. One known solution of this problem is the use of a complementary phase shift mask (CPSM) process which is also called alternating aperture phase shift mask (AAPSM) process.

Figure 1:
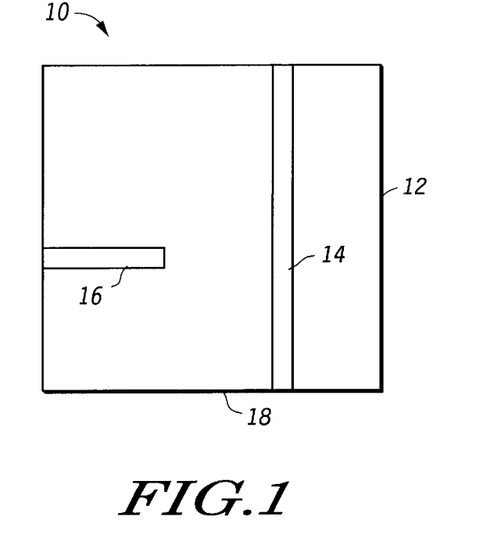
FIG. 1 is a top view of a portion of a semiconductor wafer having a desired pattern.
Figure 2:
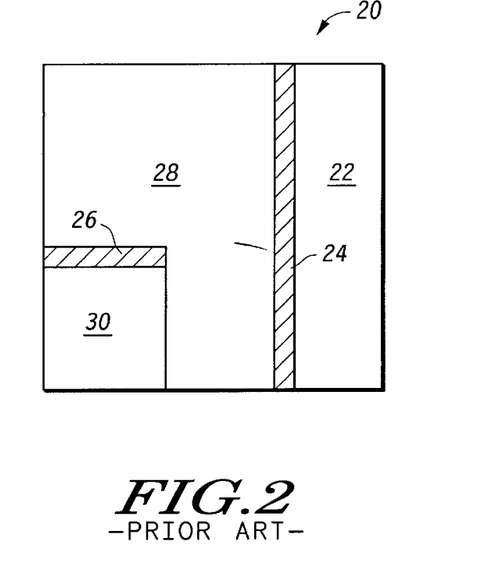
FIG. 2 is a portion of a mask of the prior art corresponding to the desired pattern of FIG. 1.

Some disadvantages of phase shift masks and of the CPSM process are exemplified by reference to a desired pattern of gate electrodes 14 and 16 as shown in FIG. 1. Typically, such gate electrodes are the finest dimensions on the integrated circuit and are polysilicon. Thus the most advanced lithographic techniques are typically applied to polysilicon, but it could be a different gate material, and it could be a different purpose than for gates. Using a phase shift mask to attempt to achieve this desired pattern, begins with the formation of a phase shift mask 20 having phase shifting regions 22 and 30 and a transparent region 28 formed on a plate which is transparent to the light used to expose photoresist, for example, a quartz plate for deep ultraviolet light, as shown in FIG. 2. The difference between phase shifting regions 30 and 22 and the transparent region 28 is the thickness of the plate. Typically, phase shifting regions 22 and 30 are thinned down regions of the plate, and transparent region 28 is not typically thinned. The plate passes light which is referenced to be at a phase angle of 0° and the phase shifting region passes light which is 180° out of phase with the 0° light. The 0° light has a non-zero light intensity that alters a property of the photoresist. Additionally the 180° light also has a non-zero light intensity and alters a property of the photoresist in a manner identical to the 0° light. In the region between the 0° light and the 180° light, light destructively interferes to form a "dark" area of low light intensity. This is the desirable feature of phase shift mask techniques. On mask 20, regions 24 and 26 correspond to the intended dark regions on the photoresist-covered wafer, are formed out of chromium or another opaque material, and are positioned between phase shifting region 30 or 22 and transparent region 28.

Figure 3:
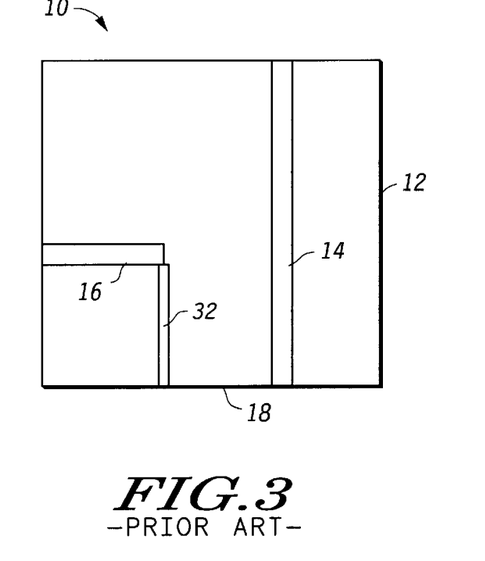
FIG. 3 is a top of the semiconductor wafer of FIG. 1 after use of the mask of FIG. 2 according to the prior art.

Developing semiconductor wafer 10 with phase shift mask 20, however, results in semiconductor 10 shown in FIG. 3. Gate electrode regions 16 and 14 have been patterned as desired. However a polysilicon phase conflict region 32 exists which arises from under-exposed photoresist as well. At the boundary between the 0 degrees and 180 degrees phase-shifted light there is destructive interference so that the photoresist in this boundary region may not be sufficiently exposed. The result of such insufficient exposure is that the photoresist in that area is not removed so that the subsequent etch of polysilicon results in an undesirable polysilicon phase conflict region 32 being formed. The result is that the very aspect of destructive interference that is desirable for gate formation has a similar effect at the boundary between the 0 degrees and 180 degrees phase shifting regions such as regions 30 and 28. Although, region 32 is undesirable as shown, there may be other situations where a similar region formed at a boundary between 0 degrees and 180 degrees regions may be used to advantage, for example, to form a thin gate. For general designs, such so-called phase conflicts are mathematically unavoidable.

The CPSM process was developed to prevent this undesirable polysilicon phase conflict region 32 arising from the 0 degrees and 180 degrees boundaries. The CPSM process adds a second, binary mask which is complementary to phase shift mask 20 for use in an exposure subsequent to that using phase shift mask 20. This second mask exposure occurs before the etch of the polysilicon so that the polysilicon region 32 is not actually formed. Region 32, however, does correspond to an under exposed portion of the photoresist after exposure using mask 20. The binary mask is opaque everywhere with regard to FIG. 3 except over polysilicon phase conflict region 32. Thus, after exposing semiconductor wafer 10 with the binary mask, removing the exposed photoresist, and etching the polysilicon, the desired semiconductor feature 10 of FIG. 1 may be substantially achieved. Due to alignment problems between mask 20 and the complementary mask, it is likely that either some portion of region 32 be present or some portion of region 16 not be present, and in either case resulting in a somewhat different pattern than the desired pattern.

As discussed, in the solution provided by the CPSM process, the semiconductor wafer undergoes two exposures using different masks. This is disadvantageous in a semiconductor-processing environment because it increases cycle time and requires highly accurate alignment of two mask exposures. In addition the additional mask is an added cost. Accordingly, there is need for improvement over phase shift mask technology as it currently exists.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

On a semiconductor wafer, which is used for forming integrated circuits, features are typically formed by exposing photoresist according to a pattern. One typical feature is a polysilicon gate. When forming the polysilicon gate, on opposing sides of where the polysilicon gate is to be formed, the photoresist is exposed to light which has a first polarization state, for example, plane polarized in a first direction, and out of phase by 180 degrees on the opposing sides of the polysilicon gate. This results in a high-resolution exposure of the photoresist for the purpose of forming the desired polysilicon gate. In other regions of the integrated circuit the areas of photoresist that are exposed to the polarized light are joined together by a region of photoresist that is exposed to light which is also polarized but with a polarization state orthogonal to the first polarization state, for example, plane polarized in a direction 90 degrees from the first direction. Thus in this boundary area the illuminated regions with orthogonal polarization states will not destructively interfere with each other so the photoresist in that boundary area receives sufficient intensity to expose the photoresist. This allows for the desired result shown in FIG. 1 without requiring an additional mask step.

Figure 4:
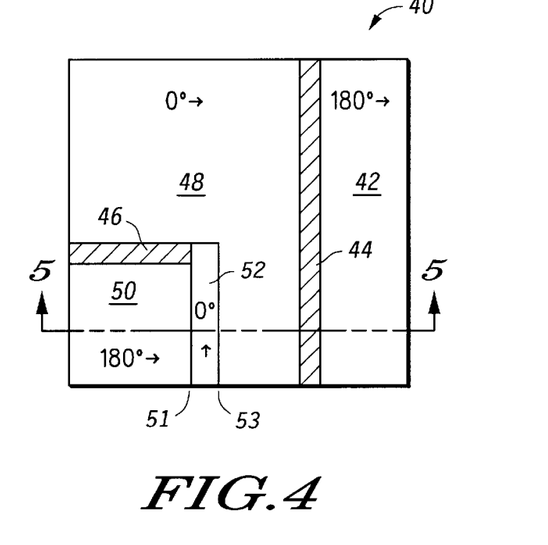
FIG. 4 is a mask corresponding to the desired pattern of FIG. 1 according to an embodiment of the invention.

Shown in FIG. 4 is a mask 40 which is utilized to form the desired result shown for integrated circuit portion 10 of FIG. 1. Mask 40 has a region 42 which corresponds to region 12 of FIG. 1, a chromium line 44 which corresponds to polysilicon gate 14 of FIG. 1, regions 48, 50, and 52 which correspond to region 18 of FIG. 1, and a chromium line 46 which corresponds to polysilicon gate 16 of FIG. 1. Region 50 and region 52 are different from each other and different from region 48. Region 42, region 50 and region 48 have a polarizing effect in a first direction. Further, region 50 has a 180 degrees phase shifting effect in relation to that of region 48. Thus, light passing through region 48 and region 50 are polarized in a first direction and are phase shifted by 180 degrees with respect to each other. Region 48 is shown as being 0 degrees and region 50 is shown as being 180 degrees. Similarly, region 42 polarizes the light that it receives, as is done in region 48, and is phase shifted 180 degrees in relation to that of region 48.

Chromium line 44, shown as cross-hatched because it is not transparent, separates region 48 and region 42. In some embodiments of this invention, this opaque feature may not be present, and regions 48 and 42 may adjoin. Similarly, chromium line 46 separates region 50 and region 48 and may be present in order to reduce the exposure of photoresist on a semiconductor wafer under it. There are also cases where a designer of the mask may leave out chromium line 46 and simply rely on the 0 degrees and 180 degrees boundary to provide for unexposed photoresist underneath. In the area where polysilicon line 32 of FIG. 3 was formed, region 52 is present. Region 52 also polarizes the light but at an angle 90 degrees different from that polarized by regions 50, 48 and 42. The result of this is that light passing through region 52 does not interfere with light passing through region 50 at a border 51 which is a line between region 52 and region 50. Similarly, light passing through 52 does not interfere with light passing through region 48 at a border 53 between region 52 and region 48. The result is the photoresist underlying region 52 is substantially exposed so that the desired result shown in FIG. 1 is achieved. Region 52 is shown as being 0 degrees in phase shift but the same beneficial effect of non interference could be obtained if it was 180 degrees or any other amount out of phase. Another beneficial feature is that, since mask 40 is perfectly aligned to itself, the exposure of region 52 is perfectly and automatically aligned to the exposures of regions 48 and 50, and is done at the same time. This ensures alignment accuracy and throughput enhancement.

Figure 5:
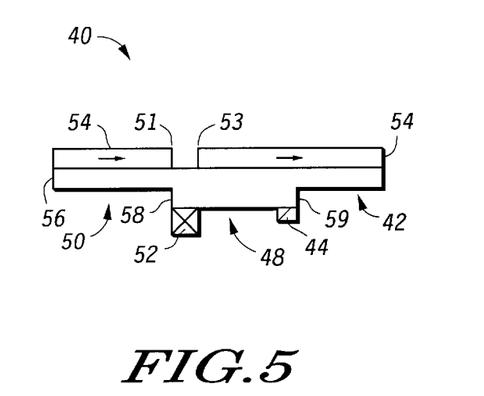
FIG. 5 is a cross section of the mask of FIG. 4.

A cross section of mask portion 40 is shown in FIG. 5. A phase shifting material 56 is shown in FIG. 5 which varies in depth to provide the 180 degrees phase shift. In the thicker areas the phase shift is considered 0 degrees. In the thinner areas the phase shift is 180 degrees in relation to that passing through the thicker areas. This aspect of using different thickness to obtain the 180 degrees phase shift is known in the art. Region 50 comprises a polarizing material 54 which overlies phase shifting material 56. Similarly, the polarizing material 54 is shown extending from border 53 to the end of region 42. Region 52 comprises polarizing material, usually the same material as polarizing material 54, however, the direction of polarization is 90 degrees from that in the regions 50 and 42. Chromium strip 44 underlies phase shifting material 56 at a thick portion of phase shifting material 56. Region 48 is between chromium strip 44 and region 52. Light passing through region 48 is polarized by the polarizing material 54. Polarizing material 54 is selected according to the wavelength of the light being utilized. It is chosen so that it polarizes effectively that wavelength of light. For example, if ultraviolet is used, then the same materials used in high quality photographic polarizing filters may be utilized.

Figure 6:
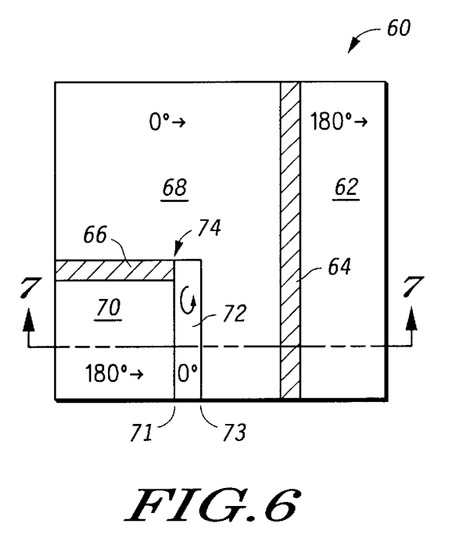
FIG. 6 is a mask corresponding to the desired pattern of FIG. 1 according to another embodiment of the invention.

Shown in FIG. 6 is another mask portion 60 similar to that shown in FIG. 4 which will also achieve the desired results shown in FIG. 1. Mask portion 60 comprises a region 62 which corresponds to region 12 in FIG. 1, a chromium strip 64 which corresponds to polysilicon gate 14 of FIG. 1, a region 68, a region 72 and a region 70 which correspond to region 18 of FIG. 1, and a chromium strip 66 which corresponds to polysilicon gate 16 of FIG. 1. The principles utilized are very similar. In this case, however, mask portion 60 is flooded with light which has already been polarized in a first direction. Region 72 provides a 90 degree rotation to the polarization direction of the light received. Rotation of polarization direction can be achieved by different approaches. The most commonly employed approach utilizes the birefringence properties of an anisotropically structured material, thus the material of region 72 is called a birefringent material. The result is thus essentially the same as for using mask 40 in FIG. 4. The boundary region, region 72 provides for polarized light, which has a polarization direction 90 degrees from that passing through region 68, exposing the photoresist in a corresponding region in the wafer under mask 60. Thus, the interface between region 68 and region 70 provided by region 72 provides for light which does not interfere with the light passing through region 68 and the light passing through region 70 at borders 71 and 73, border 71 being between region 70 and 72, and border 73 being between region 72 and region 68. The particular birefringent material is selected based on the wavelength of the light utilized. For example, for a wavelength of 248 nm, the material may be $HfO_2$.

Figure 7:
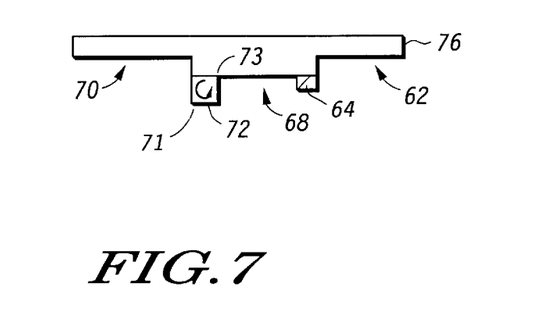
FIG. 7 is a cross section of the mask of FIG. 6.

Shown in FIG. 7 is a cross section of FIG. 6. In this case region 72, which is between border 71 and 73 shown in FIG. 7, is comprised of a birefringent material which causes a 90 degree rotation of the polarization direction of the light passing through it. Since the light received is already polarized, the polarization direction of light passing through region 72 has a 90 degree rotation with respect to the light received. Thus, between border 71 and 73, light passes through region 72 and does not interfere with the light passing through region 68 and region 70. Mask portion 60 shown in FIG. 7 has a phase shifting material 76 similar to that shown in FIG. 5 in which the thicker portion provides what is considered to be a 0 degrees phase shift and the thinner portion provides what is the 180 degrees out of phase with that passing through the thicker portion. The desirable cancellation of light under chromium strip 64 occurs because of this change in thickness of phase shifting material 76. As in previous cases, there is an alternative embodiment in which this chromium feature is absent and regions 68 and 62 adjoin. The light passing through portion 62 is 180 degrees out of phase with that passing through region 68 resulting in the desired non exposure of the photoresist underlying region 64.

Thus it is shown that by providing a region in which light is polarized 90 degrees from the light used in performing phase shifting to avoid unwanted destructive interference results in avoiding the need for an additional masking step and thus avoids the problems, such as alignment tolerance issues, with having to apply an additional mask. By having a separate region at the boundary between the two regions which are 180 degrees phase shifted from one another, there is a desirable benefit. So exposing a first region and a second region to polarized light, which is phase shifted by 180 degrees, is effective in providing a high resolution exposure of photoresist while avoiding the exposure of the photoresist in the area directly under the region which is intended to be blocked. These two regions which do have this 180 degrees phase shifting characteristic are then joined together by a region which provides a 90 degrees polarizing change from that used in the desirable destructive interference of the light which is 180 degrees phase shifted. Thus the boundary between the two 180 degrees phase shifted regions does not create the problem of having an area of photoresist which is not adequately exposed. Accordingly, there may be other ways to obtain the characteristic of being effective in having polarized the phase shifted light to be used for the desirable destructive interference while having a 90 degrees polarization for the area between the two regions where they must be joined. For example, the polarization may include linear, circular, and/or elliptical polarization.

Thus, the problem at the boundary between what can be considered two out of phase lights, is solved using a third light, or boundary light, which is polarized at the boundary. In the embodiments shown in FIGS. 4–7, both of the out of phase lights are also polarized. A similar effect can be achieved by just having the light at one side of the boundary be polarized. For example, with reference to FIG. 5, region 52 can be removed. The effect is that light passing through the boundary region between regions 50 and 42 will not be polarized. Using the example of plane polarization, light passing through regions 50 and 42 will be polarized so as to have a light present in a first planar direction, for example, the x direction. These out of phase lights, however, will not have the y direction present. The light passing through the boundary will have both the x and y direction because it is not polarized. The x-direction component of the boundary light will destructively interfere with the light passing through region 50 because they are out of phase and in the same direction, but the y-direction component of the boundary light will not interfere with light passing through region 50 because it does not have the y direction. The light passing through region 42 will not destructively interfere with the boundary light because they are in phase. The result is that the photoresist under the boundary is exposed by the y direction. To the extent the x direction that passes from region 50 is destructively interfered with by the x direction of the boundary light, it is replaced by the y direction of the boundary light. Thus, the polarization on one side of the boundary has the effect of removing at least some component of the light. The light at the edge of the boundary where the phase shift actually occurs includes at least that component so there is not destructive interference of that component even though it is out phase.

A side effect of this approach is that the photoresist will not be uniformly exposed. Of course there must be enough exposure for the photoresist to be exposed. The least exposure will be under the areas where the polarization occurs. Thus, in order for there to be sufficient exposure by the polarized light, the rest of the photoresist will receive more than a sufficient amount of exposure. For a mere doubling of the sufficient amount is not a problem. A problem of overexposure for typical photoresists is far greater than several times more than the sufficient amount.

Another issue for all of the embodiments is alignment between the polarized regions and the edge of the out of phase boundary. Referring to FIG. 5, for example, edge 58 is the edge of the out of phase boundary. It is desirable that edge 58 align with border 51 of region 50 and that region 52 align with edge 58. If border 51 extends past edge 58 and overlaps region 52, no light in that overlap region will pass on to the photoresist. This problem can also occur if regions 42 and 52 overlap. The light on each side of the overlap will have some effect on the photoresist so that it may still be sufficiently exposed. But the less misalignment the better. Misalignment in the other direction of border 51 is not much of a problem if region 52 is perfectly aligned with edge 58. In such case unpolarized light is present along side edge 58 and is out of phase with light passing from region 52 so there will be some destructive interference but there will also be components of the unpolarized light for which there will not be destructive interference and thereby provide the exposure of the photoresist. If, however, region 52 is spaced away from edge 58, and border 51 is spaced back from edge 58, then there will be unpolarized light on both sides of edge 58 that will be out of phase and thus suffer destructive interference.

Accordingly, it may be desirable to remove regions 50 and 42 entirely and simply use region 42 to provide for adequate reduction in the destructive interference caused by the phase change at edge 58. With the removal of region 42, chromium line 44 could be moved to the top surface of mask 40. As shown in FIG. 5, edge 59 is the edge of the other phase shift boundary. If it were moved to the top surface it could be anywhere over edge 59 so alignment should not be a problem. With only region 52 on the bottom surface of mask 40, it would be straightforward to make region 52 so that it aligned with edge 58. During patterning of region 52, edge 58 could also be formed to ensure that region 52 was aligned with edge 58. The width of region 52 would be determined by a subsequent patterning. The width of region 52 is not particularly significant except that it should not be too close to edge 59 where it could reduce the desirable destructive interference at the location.

Figure 8:
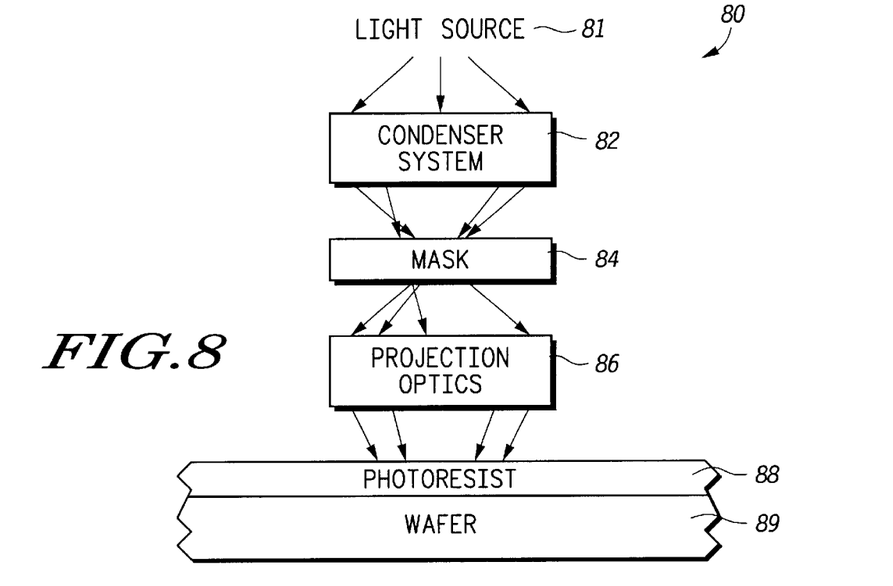
FIG. 8 is an apparatus for using the mask of FIG. 4.

Shown in FIG. 8 is an apparatus 80 which can be utilized in exposing a mask 84 in the manner described for FIGS. 4 and 5. In this case mask 84 contains mask portion 40. Apparatus 80 comprises a light source 81, a condenser system 82, a mask 84, projection optics 86, and a wafer 89 having a photoresist layer 88 overlying it. Condenser system 82 receives light generated from light source 81 and applies it to all of mask 84 that has the features to be applied to wafer 89. Mask 84 then masks off portions of the light received from condenser system 82. Projection optics 86 then focuses the light on photoresist 88 so that photoresist 88 is selectively exposed according to a pattern present on mask 84. Thus it is seen that a desirable benefit of utilizing mask 84 is that a conventional stepper using mask 84 may be utilized in achieving the desired result shown in FIG. 1. Wafer 89 in this described situation would have portion 10 of FIG. 1 on it after photoresist 88 has been exposed and selectively removed with the subsequent step of polysilicon also being selectively removed according to the pattern present on the photoresist. An unpolarized light is provided which is converted to three lights. Two lights are phase shifted from one another and may be polarized. A third light is polarized, and if the two lights are polarized, the third light is polarized to a different state than the two lights.

Figure 9:
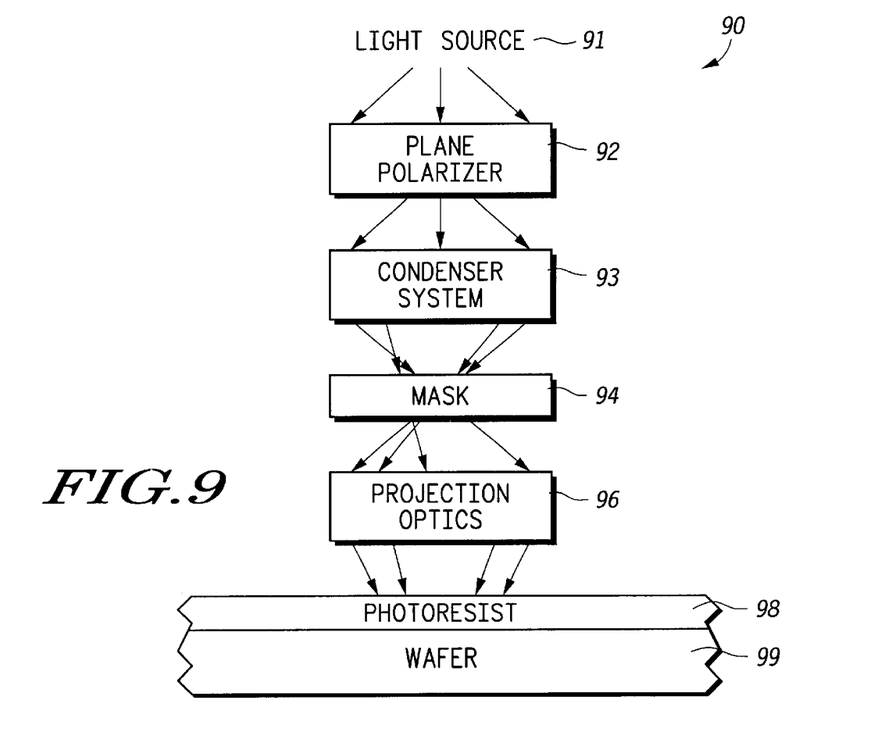
FIG. 9 is an apparatus for using the mask of FIG. 6.

Shown in FIG. 9 is an apparatus 90 useful in performing the method described for FIGS. 6 and 7. Apparatus 90 comprises a light source 91, a plane polarizer 92, a condenser system 93, a mask 94, projection optics 96, a wafer 99 having a photoresist layer 98 with a pattern shown in FIG. 1 thereon. In this case, light source 91 is polarized by plane polarizer 92. Condenser system 93 ensures that all the pattern present on mask 94 is exposed to the polarized light resulting from light passing through plane polarizer 92. Mask 94 then blocks the polarized light received from condenser system 93 according to the pattern present on mask 94. Projection optics 96 then focus this polarized and patterned light on photoresist 98. Mask 94 includes thereon mask portion 60. Thus mask 94 includes the pattern shown in FIG. 6. As a result of utilizing apparatus 90, photoresist 98 is patterned as desired and shown in FIG. 1. As a result of photoresist 98 being so patterned, photoresist 98 has its exposed portions removed with the result that polysilicon underlying photoresist 98 and present on wafer 99 is successfully patterned to achieve the results shown in FIG. 1. Similarly, one polarized light is provided and converted into three. Two are out of phase and have a first polarization state and the third has a second polarization state.

The apparatus depicted in FIGS. 8 and 9 forms an integration for using masks 84 and 94 with projection printing, which is commonly used in modern optical lithography. There are, however, other printing techniques, for example, proximity printing, which can be used based on the same principles and to achieve the same effects.

Figure 10:
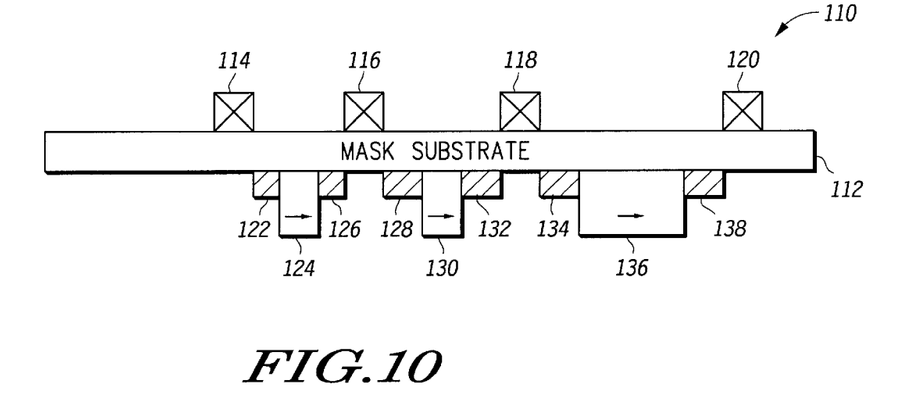
FIG. 10 is a cross section of a mask according to yet another embodiment of the invention.

Another use of polarized light in exposing photoresist on an integrated circuit is demonstrated by reference to FIG. 10 which depicts a mask 110. Mask 110 comprises a substrate 112, a polarizing region 114, a polarizing region 116, a polarizing region 118 and a polarizing region 120. These polarizing regions 114, 116, 118 and 120 provide polarizing in a first direction. Mask portion 110 further comprises a chromium blocking layer 122, a polarizing region 124, a chromium blocking region 126, a chromium blocking region 128, a polarizing region 130, a chromium blocking region 132, a chromium blocking region 134, a polarizing region 136 and a chromium blocking region 138. Polarizing regions 124, 130, and 136 provide polarizing in a second direction which is optimally 90 degrees from the first direction.

This mask portion 110 is used to reduce the problems of optical proximity effects. This occurs commonly in integrated circuits when features that are of the same type and close together are processed somewhat differently than a feature of the same dimension and type but which is distant from other features. This comes up particularly in metal lines which are made thinner in an area where these metal lines are close together than in an area where there is a single metal line or where the metal lines are spaced further apart or are wider. The same effect occurs when dense collection of gates as well as sparse ones are used in a design. This makes circuit design more difficult because the width and therefore the resistance of these conductive layers in lines is harder to predict, or in the case of gate lengths varying the transistors do not match the desired performance and thus degrade the implementation of the design in the lithographic technology. The problem occurs as a result of interference between light which is on opposite sides of a blocking feature. The problem is compounded because the electric field of the light coming from one side is added directly and in phase with the electric field of the light coming from the other side. Thus the photoresist receives this constructive interference in phase. Because they are in phase the electric field is added one to one and thus the energy is more than doubled because the energy is the square of the applied electric field. Thus, for example, if an electric field which is nominally 1 is added to an electric field of 1, the energy is not just 2, but it is 4.

Mask portion 110 shown in FIG. 10 provides for the light that is adjacent on both sides of the blocking feature to be 90 degrees different in polarization direction. Shown in FIG. 10, for example, is blocking feature 122 which on one border has polarizing region 114 and on the other has polarizing region 124. Also adjacent to polarizing region 124 is blocking feature 126 which has polarizing region 116 adjacent to it. So, for example, photoresist under blocking region 122 is intended to be not exposed at all. Due to the nature of the light, however, some of the light passing through polarizing region 114 and polarizing region 124 does reach photoresist which is under and intended to be blocked by blocking feature 122. Further, some of the light passing through region 116 also reaches the photoresist intended to be blocked by blocking region 122. This adds to the proximity effect that is undesirable. With polarizing regions 114 and 116 being present, light passing through 114 and 116 is 90 degrees different in polarization direction from that passing through region 124. Thus, although light passing through regions 114 and 116 does reach, to some extent and detrimentally, to the photoresist intended to be blocked by region 122, the light passing through regions 114 and 116 has an electric field that is 90 degrees different in direction from that passing through region 124. The result is that the energy is simply added to that provided detrimentally by region 124. Although this is not a desirable effect that the light passing through regions 114 and 116 and 124 reach the photoresist under region 122, it is less detrimental than if the electric fields had the same polarization and phase because if the electric fields had the same polarization and phase, the electric fields would add so that the energy, which is calculated as the square of the electric field, is much greater.

Accordingly, the mask shown in FIG. 10 is beneficial in reducing optical proximity effects. Thus a benefit is derived from having light polarized in a first direction and light polarized in a second direction be on opposite sides of a blocking feature. Mask substrate 112 could be of a typical material used for passing light for a mask utilized in exposing photoresist. Polarizing regions 114, 116, 118, 120, 124, 130 and 136 are chosen based upon the frequency or the wavelength of the light utilized in exposing the photoresist. Also portion 110 can be used on the mask shown in FIGS. 8 and 9. Thus mask 84 of FIG. 8, for example, would not only include mask portion 40 but would also include mask portion 110. Similarly, for apparatus 90 mask 94 would not only include the mask portion 60 shown in FIG. 6 but also include mask portion 110 of FIG. 10.

While the invention has been described in various embodiments, there may be other alternatives that fit within the scope of the invention as defined by the claims. For example, a light source may be any source of electromagnetic waves and not limited, for example, to ultraviolet light. The phase shifting may be achieved by means other than varying thickness, for example by varying the materials to obtain differing indexes of refraction. The shapes of the features do not necessarily have to be at right angles or even be defined by straight lines. They could be rounded, for example. Thus, the claims that follow define the true scope of the invention.

What is claimed is:

1. A method of making an integrated circuit, comprising:
   using a light source to lithographically define regions of the integrated circuit;
   providing a first region on the integrated circuit which defines a feature, the first region not being exposed to the light source during processing which defines boundaries of the first region;
   providing a second region on the integrated circuit which is adjacent to the first region in which material to be incorporated in the integrated circuit will be etched;
   providing a third region adjacent to the first region but not in contact with the second region in which material to be incorporated in the integrated circuit will be etched;
   exposing the second region of the integrated circuit to a first polarized light having a first polarization;
   exposing the third region of the integrated circuit to a second polarized light having the first polarization and having a phase differential with respect to the first polarized light;
   providing a fourth region on the integrated circuit that joins the second region to the third region; and
   exposing the third region of the integrated circuit to a light having a second polarization which is different from the first polarization.

2. The method of claim 1, wherein the light having the second polarization is polarized to the second polarization and the second polarization is nominally orthogonal to die first polarization.

3. The method of claim 1 further comprising:
   creating the first region by using a single reticle.

4. The method of claim 1 further comprising:
   creating the phase differential as substantially a one hundred eighty degree difference in phase.

5. The method of claim 1 further comprising:
   implementing the first polarization and the second polarization as one of linear polarization circular polarization, and elliptical polarization.

6. The method of claim 1 further comprising:
   placing a polarizing film between the light source and the regions of the integrated circuit to create the light source having the first polarization.

7. A method of making an integrated circuit on a wafer, comprising:
   forming photoresist on the wafer;
   exposing a first portion of the wafer to a first polarized light with a first polarization state;
   exposing a second portion of the wafer to a second polarized light with the first polarization state and phase shifted from the first light; and
   exposing a third portion of the wafer joining a first predetermined amount of the first portion to a second predetermined amount of the second portion to a third light which has a second polarization state that is different from the first polarization state.

8. The method of claim 7 wherein a third predetermined amount of the first portion and a fourth predetermined amount of the second portion are separated by a substantially unexposed portion.

9. The method of claim 7 wherein the first light is about one hundred eighty degrees out of phase with the second light.

10. The method of claim 7 wherein the first polarization state is substantially orthogonal to the second polarization state.

11. The method of claim 10, wherein the first polarization state is plane polarization in a first direction and the second polarization state is plane polarization in a second direction orthogonal to the first direction.

12. The method of claim 11, wherein the first light is about 180 degrees out of phase with the second light.

13. The method of claim 7, wherein the first polarization state is plane polarization in a first direction and the second polarization state is plane polarization in a second direction.

14. The method of claim 13, wherein the first direction is substantially orthogonal to the second direction.

15. The method of claim 14, wherein the first light is about 180 degrees out of phase with the second light.

16. The method of claim 15 wherein the exposing the first portion, the exposing the second portion, and exposing the third portion occur simultaneously.

17. A method of making an integrated circuit, comprising:
   providing a substrate having a semiconductor surface;
   applying photoresist to the semiconductor surface;
   providing mask means for passing a first polarized light therefrom which is characterized as comprising a first polarization state, wherein;
     the mask means comprises phase shifting means for providing a first portion of the first polarized light that is phase shifted in relation to a second portion of the first polarized light to form a feature in the photoresist at a first location between the first and second portions of the first light;
     the mask mans is for passing a second light to a second location in the photoresist that is between the first and second portions of the second light;
     the second light adjoins the first and second portions of the first light; and
     the second light comprises a second polarization state different from the first polarization state; and
   applying light to the mask means so that the polarized light is passed from the mask means to the photoresist.

18. The method of claim 17, wherein the mask means comprises first and second polarizing materials.

19. A method of making an integrated circuit on a wafer comprising:
   forming photoresist over the wafer;
   directing a first light toward a first region of the wafer, wherein the first region is disposed adjacent to a first side of a boundary region and adjacent to a first side of a feature region of the wafer, wherein the first light is at a first polarization;
   directing a second light toward a second region of the wafer, wherein the second region is disposed adjacent to and on a second side of the boundary region and adjacent to a second side of the feature region of the wafer, wherein the second light is at the first polarization and is out of phase with the first light; and directing a third light toward the boundary region to expose the photoresist at the boundary, wherein the third light is not substantially polarized.

20. A method of making an integrated circuit on a wafer comprising:

forming photoresist over the wafer;

directing a first light toward a first region of the wafer, wherein the first region is disposed adjacent to a first side of a boundary region and adjacent to a first side of a feature region of the wafer, wherein the first light is at a first polarization;

directing a second light toward a second region of the wafer, wherein the second region is disposed adjacent to and on a second side of the boundary region and adjacent to a second side of the feature region of the wafer, wherein the second light is at the first polarization and is out of phase with the first light; and directing a third light toward the boundary region to expose the photoresist at the boundary, wherein the third light is at a second polarization.

21. A method of making an integrated circuit on a wafer comprising:

forming photoresist over the wafer;

directing a first light toward a first region of the wafer, wherein the first region is disposed adjacent to a first side of a boundary region and adjacent to a first side of a feature region oil the wafer, wherein the first light is not substantially polarized;

directing a second light toward a second region of the wafer, wherein the second region is disposed adjacent to and on a second side of the boundary region and adjacent to a second side of the feature region of the wafer, wherein the second light is not substantially polarized and is out of phase with the first light; and directing a third light toward the boundary region to expose the photoresist at the boundary, wherein the third light is polarized.

* * * * *

UNITED STATES PATENT AND TRADEMARK OFFICE
CERTIFICATE OF CORRECTION

PATENT NO. : 6,645,678 B2
DATED : November 11, 2003
INVENTOR(S) : Wang et al.

It is certified that error appears in the above-identified patent and that said Letters Patent is hereby corrected as shown below:

<u>Column 9,</u>
Line 42, change "die" to -- the --
Line 51, change "polarization" to -- polarization, --

<u>Column 12,</u>
Line 8, change "oil" to -- of --

Signed and Sealed this

Sixteenth Day of March, 2004

JON W. DUDAS
*Acting Director of the United States Patent and Trademark Office*